United States Patent
Miyosi et al.

(12) 
(10) Patent No.: US 6,498,485 B2
(45) Date of Patent: *Dec. 24, 2002

(54) METHOD AND APPARATUS FOR PREVENTING ARTIFACTS DUE TO MAGNETIC FIELD OUTSIDE OF FIELD OF VIEW

(75) Inventors: Mitsuharu Miyosi, Tokyo (JP); Aki Yamazaki, Tokyo (JP)

(73) Assignee: GE Yokogawa Medical Systems, Limited, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/556,924

(22) Filed: Apr. 21, 2000

(65) Prior Publication Data

US 2002/0101237 A1 Aug. 1, 2002

(30) Foreign Application Priority Data

Jun. 24, 1999 (JP) .............................. 11-177659

(51) Int. Cl.$^7$ ................................. G01V 3/00
(52) U.S. Cl. ...................... 324/307; 324/309
(58) Field of Search ................. 324/307, 309

(56) References Cited

U.S. PATENT DOCUMENTS

| | | | | |
|---|---|---|---|---|
| 4,720,679 A | * | 1/1988 | Patrick et al. | 324/309 |
| 4,983,920 A | * | 1/1991 | Lampman et al. | 324/309 |
| 5,051,699 A | * | 9/1991 | Hanawa et al. | 324/309 |
| 5,159,550 A | * | 10/1992 | Sakamoto et al. | 324/307 |
| 5,204,627 A | * | 4/1993 | Mistretta et al. | 324/307 |
| 5,233,298 A | * | 8/1993 | Dumoulin | 324/306 |
| 5,270,654 A | * | 12/1993 | Feinberg et al. | 324/309 |
| 5,296,809 A | * | 3/1994 | Roberts et al. | 324/309 |
| 5,438,263 A | * | 8/1995 | Dworkin et al. | 324/309 |
| 5,446,384 A | * | 8/1995 | Dumoulin | 324/307 |
| 5,602,476 A | * | 2/1997 | Liu et al. | 324/309 |
| 5,615,676 A | * | 4/1997 | Kohno | 324/307 |
| 5,757,188 A | * | 5/1998 | Miyazaki | 324/307 |
| 5,814,991 A | * | 9/1998 | Deimling | 324/309 |
| 6,043,656 A | * | 3/2000 | Ma et al. | 324/309 |

FOREIGN PATENT DOCUMENTS

| | | |
|---|---|---|
| JP | 4294504 | 10/1992 |
| JP | 9094241 | 4/1997 |

* cited by examiner

Primary Examiner—Edward Lefkowitz
Assistant Examiner—Dixomara Vargas
(74) Attorney, Agent, or Firm—Moonray Kojima

(57) ABSTRACT

In order to provide a gradient magnetic field application method and apparatus for preventing artifacts due to a magnetic field outside a field of view (FOV), and a magnetic resonance imaging apparatus employing such a gradient magnetic field application apparatus, in performing a plurality of RF excitations of spins of atomic nuclei within a subject to be imaged in the presence of a gradient magnetic field and producing an image based on magnetic resonance signals generated by the spins, at least the polarity of the gradient magnetic field in a first RF excitation (G90) and the polarity of the gradient magnetic field in the next RF excitation (G180) are made opposite to each other.

16 Claims, 7 Drawing Sheets

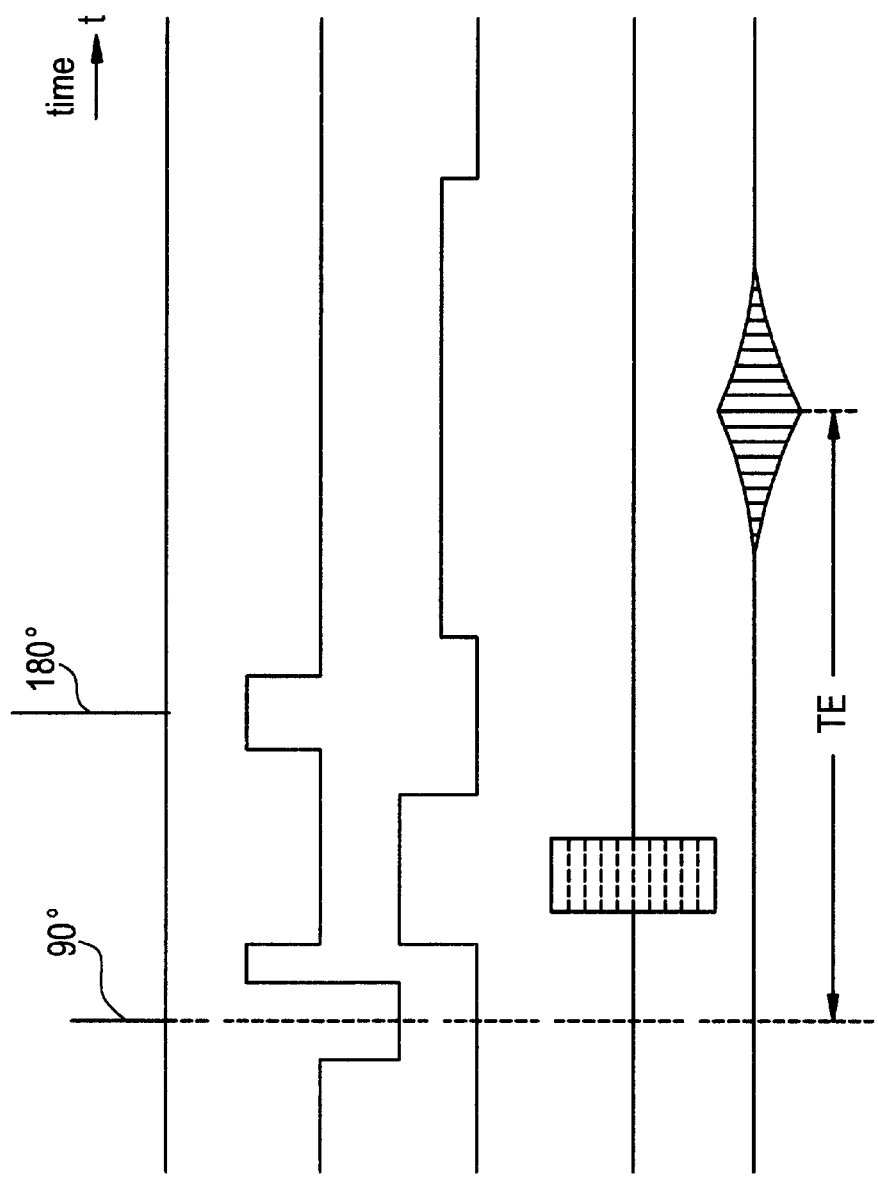
FIG. 5A RF
FIG. 5B Gs
FIG. 5C Gr
FIG. 5D Gp
FIG. 5E MR

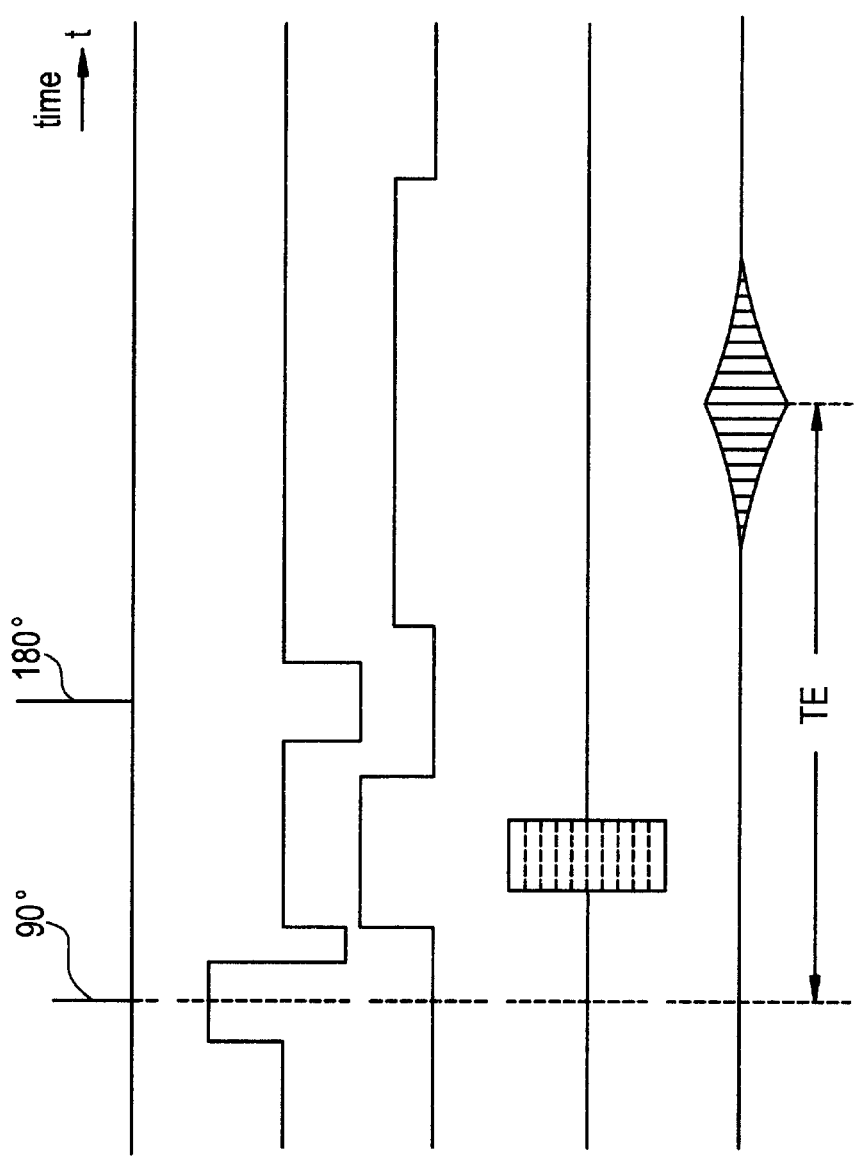
FIG. 6A (1) RF
FIG. 6B (2) Gs
FIG. 6C (3) Gr
FIG. 6D (4) Gp
FIG. 6E (5) MR

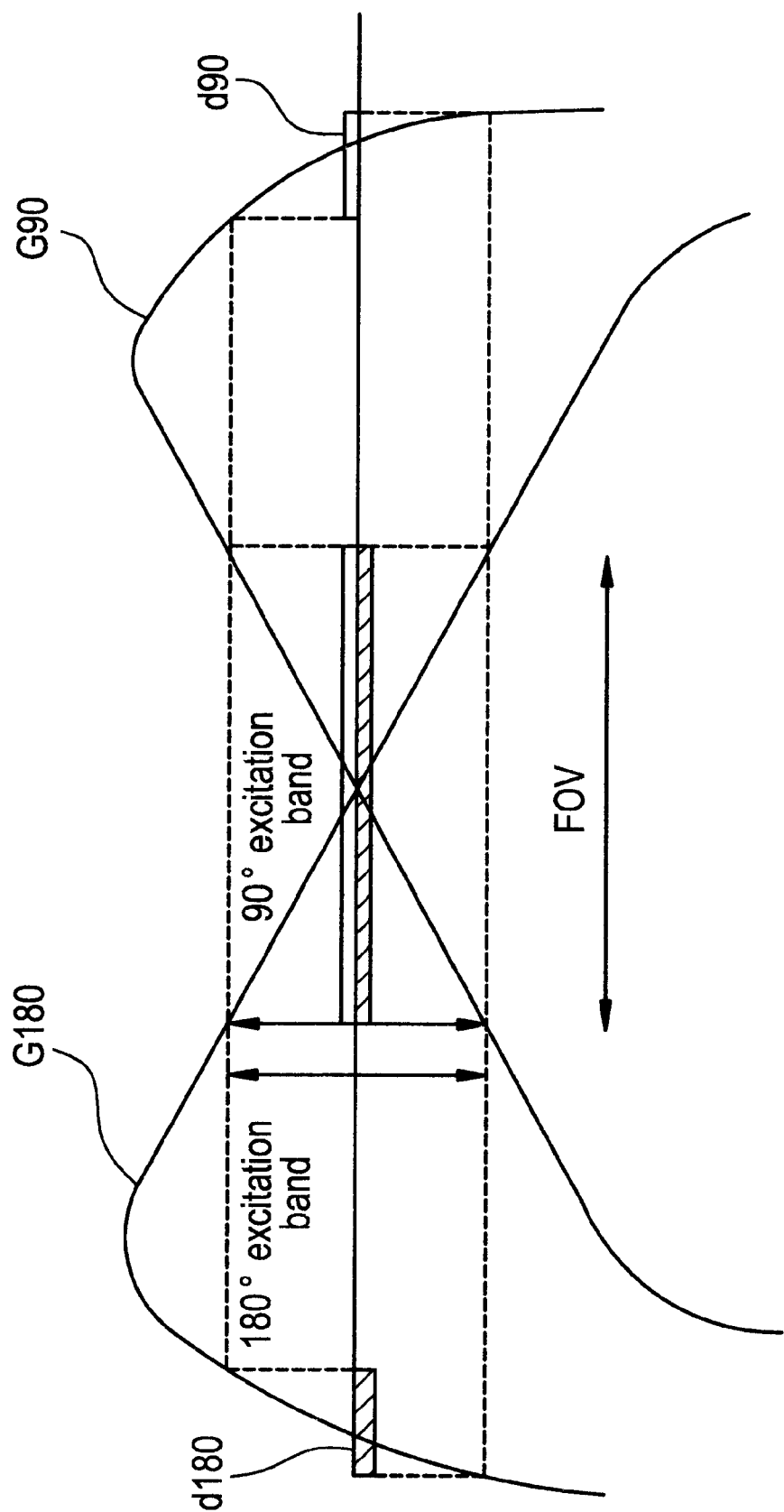

METHOD AND APPARATUS FOR PREVENTING ARTIFACTS DUE TO MAGNETIC FIELD OUTSIDE OF FIELD OF VIEW

BACKGROUND OF THE INVENTION

The present invention relates to a gradient magnetic field application method and apparatus and a magnetic resonance imaging apparatus, and more particularly to a method and apparatus for applying a gradient magnetic field in exciting spins of atomic nuclei, and a magnetic resonance imaging apparatus employing such a gradient magnetic field application apparatus.

In magnetic resonance imaging, magnetic field gradients are generated in a space to be imaged to allow the three-dimensional position of voxels to be identified by frequency of magnetic resonance signals generated by spins of atomic nuclei, such as protons. The generation of the magnetic field gradients involves generating a static magnetic field a having a uniform magnetic field strength $B_0$ in a field of view (FOV), as exemplarily shown as a profile of the magnetic field strength in FIG. 1, applying a symmetric gradient magnetic field b having a direction on one side and a direction on the other side opposite to each other with respect to the center O of the FOV, and obtaining a composite magnetic field c with a gradient by composing the magnetic fields a and b. To generate the static magnetic field a, a superconductive electromagnet, a normal conductive electromagnet, a permanent magnet or the like is employed. To generate the gradient magnetic field b, a gradient coil is employed having an appropriate loop shape.

When such a gradient magnetic field is generated, a peripheral region d is formed outside the FOV in the left portion of the drawing, i.e., on the side on which the static magnetic field a and the gradient magnetic field b have the same direction, where the composite magnetic field c has the, same strength as the magnetic field within the FOV, because both the strengths of the static magnetic field a generated by the magnet, and the gradient magnetic field b generated by the gradient coil decrease on both sides of the FOV. Accordingly, the magnetic resonance signals generated in the peripheral region d have a frequency common to the magnetic resonance signals generated in the FOV, resulting in artifacts in the obtained image due to wraparound from the outside of FOV.

Magnetic resonance imaging employing spin echoes attempts to reduce such artifacts by making the strength of a gradient magnetic field G90 applied in 90° excitation and the strength of a gradient magnetic field G180 applied in 180° excitation different, as exemplarily shown in FIG. 2. Then, the peripheral region d90 by the gradient magnetic field G90 and the peripheral region d180 by the gradient magnetic field G180 become different from each other, and those spin echoes which induce artifacts are generated in a reduced region dat where these peripheral regions overlap.

However, although the region in which the artifact-inducing spin echoes are generated is reduced by the above technique, it does not completely disappear. Therefore, the effect of reducing artifacts is still insufficient.

SUMMARY OF THE INVENTION

It is therefore an object of the present invention to provide a gradient magnetic field application method and apparatus for preventing artifacts due to a magnetic field outside a field of view (FOV), and a magnetic resonance imaging apparatus employing such a gradient magnetic field application apparatus.

In accordance with a first aspect of the invention, there is provided a gradient magnetic field application method for applying a gradient magnetic field in performing a plurality of RF excitations of spins of atomic nuclei, the method comprising the steps of making at least the polarity of the gradient magnetic field in a first RF excitation and the polarity of the gradient magnetic field in the next RF excitation opposite to each other.

In accordance with a second aspect of the invention, there is provided a gradient magnetic field application apparatus for applying a gradient magnetic field in performing a plurality of RF excitations of spins of atomic nuclei, the apparatus making at least the polarity of the gradient magnetic field in a first RF excitation and the polarity of the gradient magnetic field in the next RF excitation opposite to each other.

In accordance with a third aspect of the invention, there is provided a magnetic resonance imaging apparatus for performing a plurality of RF excitations of spins of atomic nuclei within a subject to be imaged in the presence of a gradient magnetic field, and producing an image based on magnetic resonance signals generated by the spins, the apparatus comprising gradient magnetic field application means for making at least the polarity of the gradient magnetic field in a first RF excitation and the polarity of the gradient magnetic field in the next RF excitation opposite to each other.

In accordance with a fourth aspect of the invention, there is provided a magnetic resonance imaging method for performing a plurality of RF excitations of spins of atomic nuclei within a subject to be imaged in the presence of a gradient magnetic field, and producing an image based on magnetic resonance signals generated by the spins, the method comprising the steps of making at least the polarity of the gradient magnetic field in a first RF excitation and the polarity of the gradient magnetic field in the next RF excitation opposite to each other.

EFFECT

According to the present invention, a region in which spin echoes are generated outside the FOV is removed by making at least the polarity of a gradient magnetic field in a first RF excitation and the polarity of the gradient magnetic field in the next RF excitation opposite to each other.

Thus, the present invention can provide a gradient magnetic field application method and apparatus for preventing artifacts due to a magnetic field outside a field of view, and a magnetic resonance imaging apparatus employing such a gradient magnetic field application apparatus.

Further objects and advantages of the present invention will be apparent from the following description of the preferred embodiments of the invention as illustrated in the accompanying drawings.

BRIEF DESCRIPTION OF THE DRAWINGS

FIG. 5 illustrates an exemplary pulse sequence executed by the apparatus shown in FIG. 3 or 4.

FIG. 6 illustrates another exemplary pulse sequence executed by the apparatus shown in FIG. 3 or 4.

FIG. 7 illustrates a profile of the magnetic field strength in the apparatus shown in FIG. 3 or 4.

DETAILED DESCRIPTION OF THE INVENTION

Figure 1:
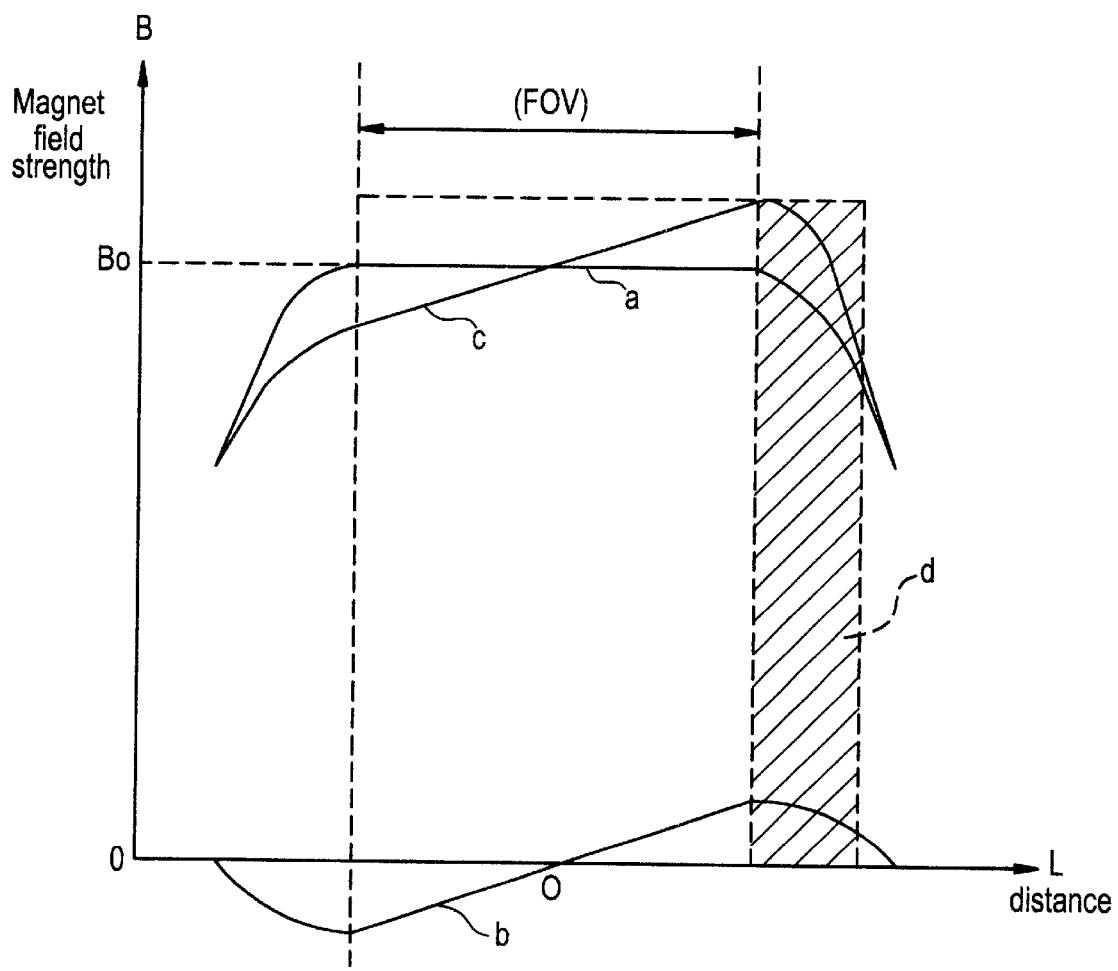
FIG. 1 illustrates a profile of the magnetic field strength in a magnetic resonance imaging apparatus.
Figure 2:
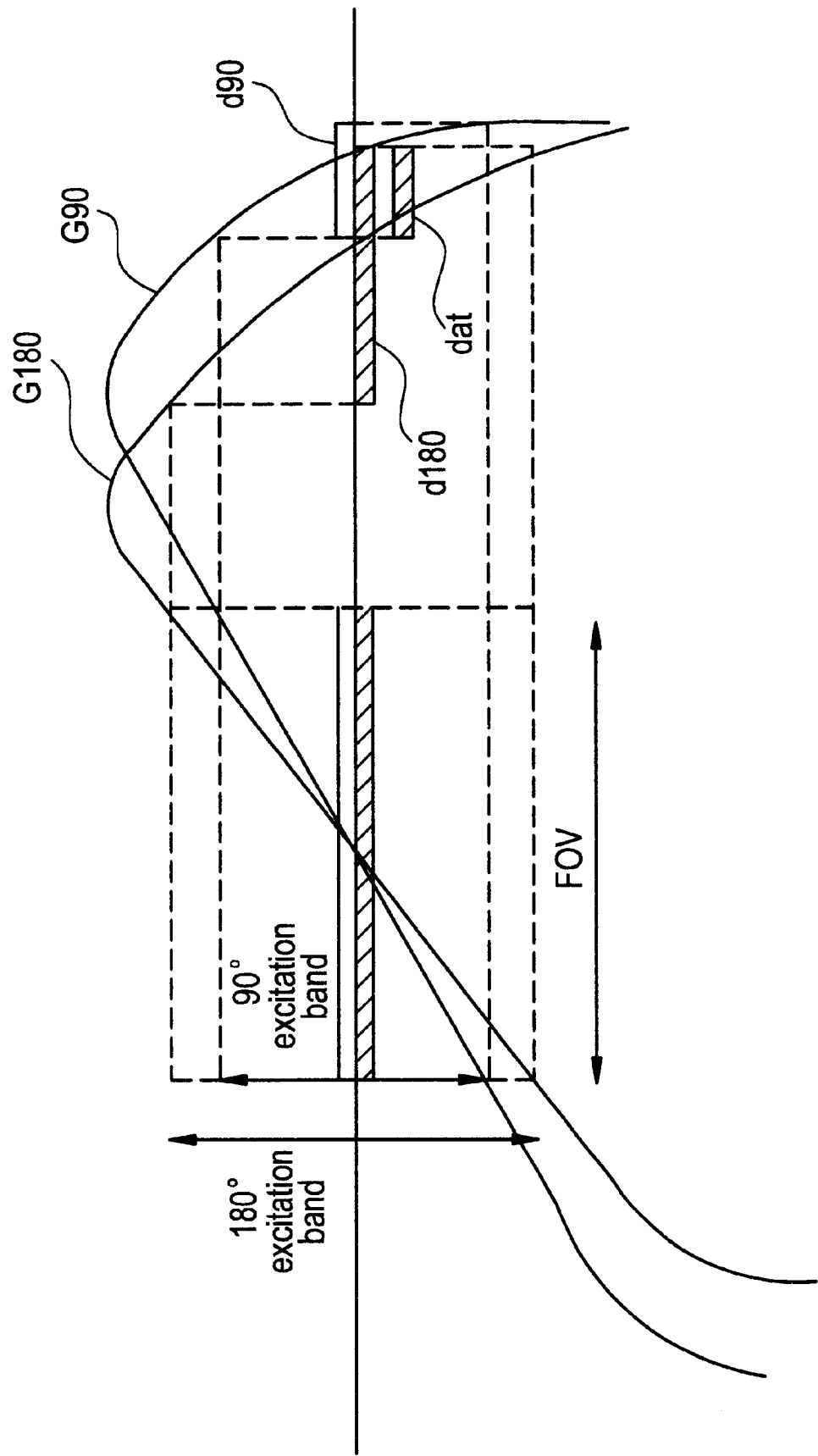
FIG. 2 illustrates a profile of the magnetic field strength in a conventional case.
Figure 3:
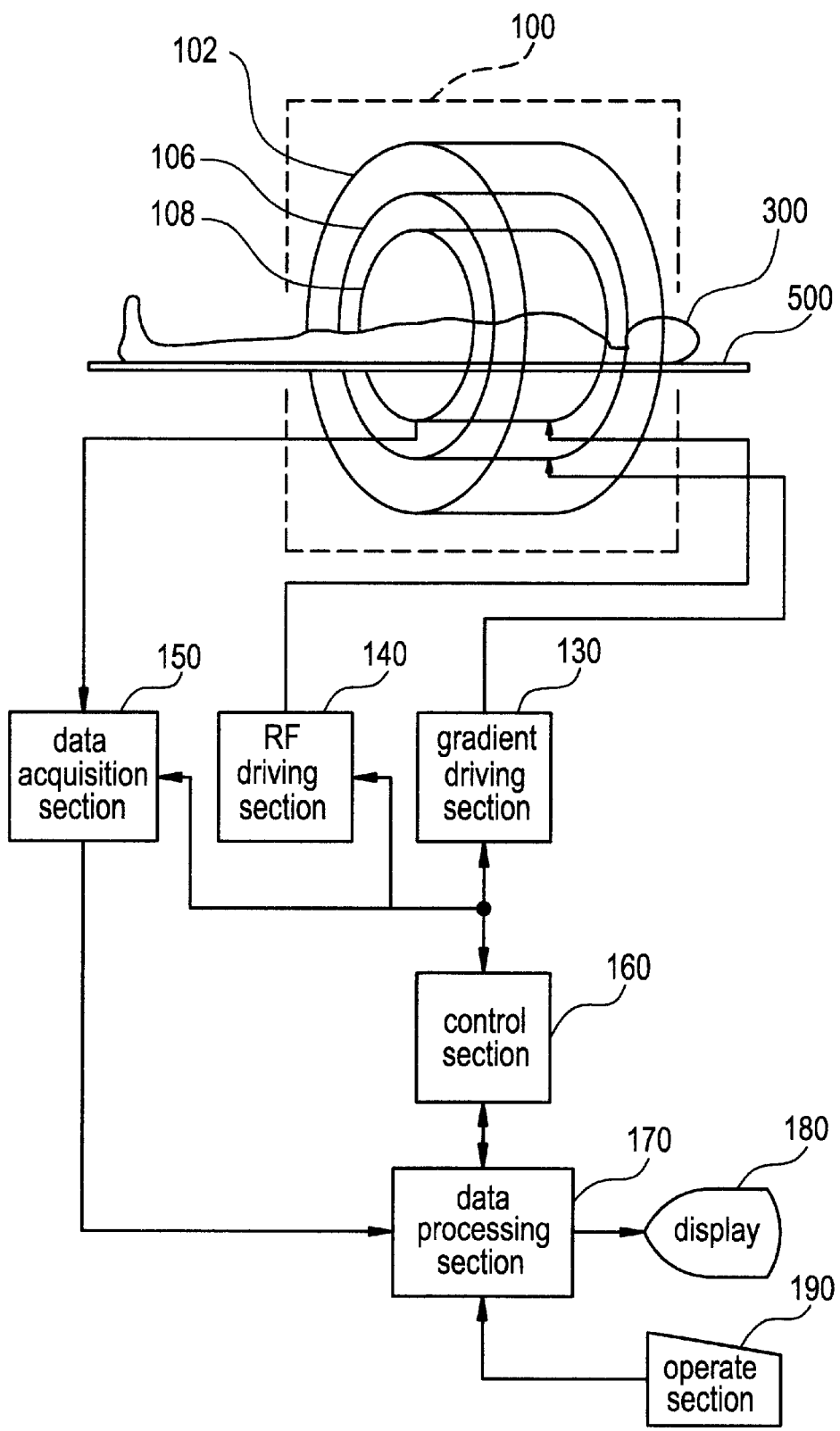
FIG. 3 is a block diagram of an apparatus in accordance with an embodiment of the present invention.

Several embodiments of the present invention will now be described in more detail with reference to the accompanying drawings. FIG. 3 shows a block diagram of a magnetic resonance imaging apparatus, which is an embodiment of the present invention. The configuration of the apparatus represents an embodiment of the apparatus in accordance with the present invention, and the operation of the apparatus represents an embodiment of the method in accordance with the present invention.

As shown in FIG. 3, the present apparatus has a magnet system 100. The magnet system 100 has a main magnetic field coil section 102, a gradient coil section 106 and an RF (radio frequency) coil section 108. These coil sections have a generally cylindrical outer shape and are concentrically disposed. A subject to be imaged 300 is rested on a cradle 500 and carried into and out of the internal space of the magnet system 100 by carrier means (not shown).

The main magnetic field coil section 102 generates a static magnetic field in the internal space of the magnet system 100. The direction of the static magnetic field is generally in parallel with the direction of the body axis of the subject to be imaged 300, i.e., a so-called horizontal magnetic field is generated. The main magnetic field coil section 102 comprises a superconductive coil, for example. It will be easily recognized that the main magnetic field coil section 102 is not limited to comprising a superconductive coil, but may comprise a normal conductive coil or the like.

The gradient coil section 106 generates gradient magnetic fields for imparting gradients to the static magnet field strength. The gradient magnetic fields to be generated include three types of magnetic fields: a slice gradient magnetic field, a readout gradient magnetic field and a phase encoding gradient magnetic field, and the gradient coil section 106 has three gradient coils (not shown) corresponding to these three gradient magnetic fields.

The RF coil section 108 generates a high frequency magnetic field in the static magnetic field space to excite spins within the subject to be imaged 300. The generation of the high frequency magnetic field will be referred to as transmission of an RF excitation signal hereinbelow. The RF coil section 108 also receives an electromagnetic wave generated by the excited spins, i.e., a magnetic resonance signal. The RF coil section 108 has a transmit coil and a receive coil (not shown). The transmit and receive coils may be either the same coil or separate dedicated coils.

The gradient coil section 106 is connected with a gradient driving section 130. A portion consisting of the gradient coil section 106 and gradient driving section 130 is an embodiment of the gradient magnetic field application apparatus of the present invention. The configuration of the apparatus represents an embodiment of the apparatus in accordance with the present invention, and the operation of the apparatus represents an embodiment of the method in accordance with the present invention. The portion consisting of the gradient coil section 106 and gradient driving section 130 is also an embodiment of the gradient magnetic field application means of the present invention. The gradient driving section 130 supplies driving signals to the gradient coil section 106 to generate the gradient magnetic fields. The gradient driving section 130 has three driving circuits (not shown) corresponding to the three gradient coils in the gradient coil section 106.

The RF coil section 108 is connected with an RF driving section 140 for supplying driving signals to the RF coil section 108 to transmit the RF excitation signals, thereby exciting the spins within the subject to be imaged 300. The RF coil section 108 is also connected with a data acquisition section 150 for gathering signals received by the RF coil section 108 and acquiring the signals as digital data.

The gradient driving section 130, RF driving section 140 and data acquisition section 150 are connected with a control section 160 for controlling these sections 130–150.

The output of the data acquisition section 150 is connected to a data processing section 170. The data processing section 170 stores data gathered from the data acquisition section 150 in a memory (not shown). Thus, a data space is formed in the memory, which constitutes a two-dimensional Fourier space. The data processing section 170 performs an inverse two-dimensional Fourier transformation on the data in the two-dimensional Fourier space to reconstruct an image of the subject to be imaged 300.

The data processing section 170 is connected to the control section 160. The data processing section 170 is superior to the control section 160 and governs the section 160. The data processing section 170 is connected with a display section 180 that displays the reconstructed image and several information output from the data processing section 170, and an operating section 190 that is operated by a human operator and inputs several commands, information and so forth to the data processing section 170.

Figure 4:
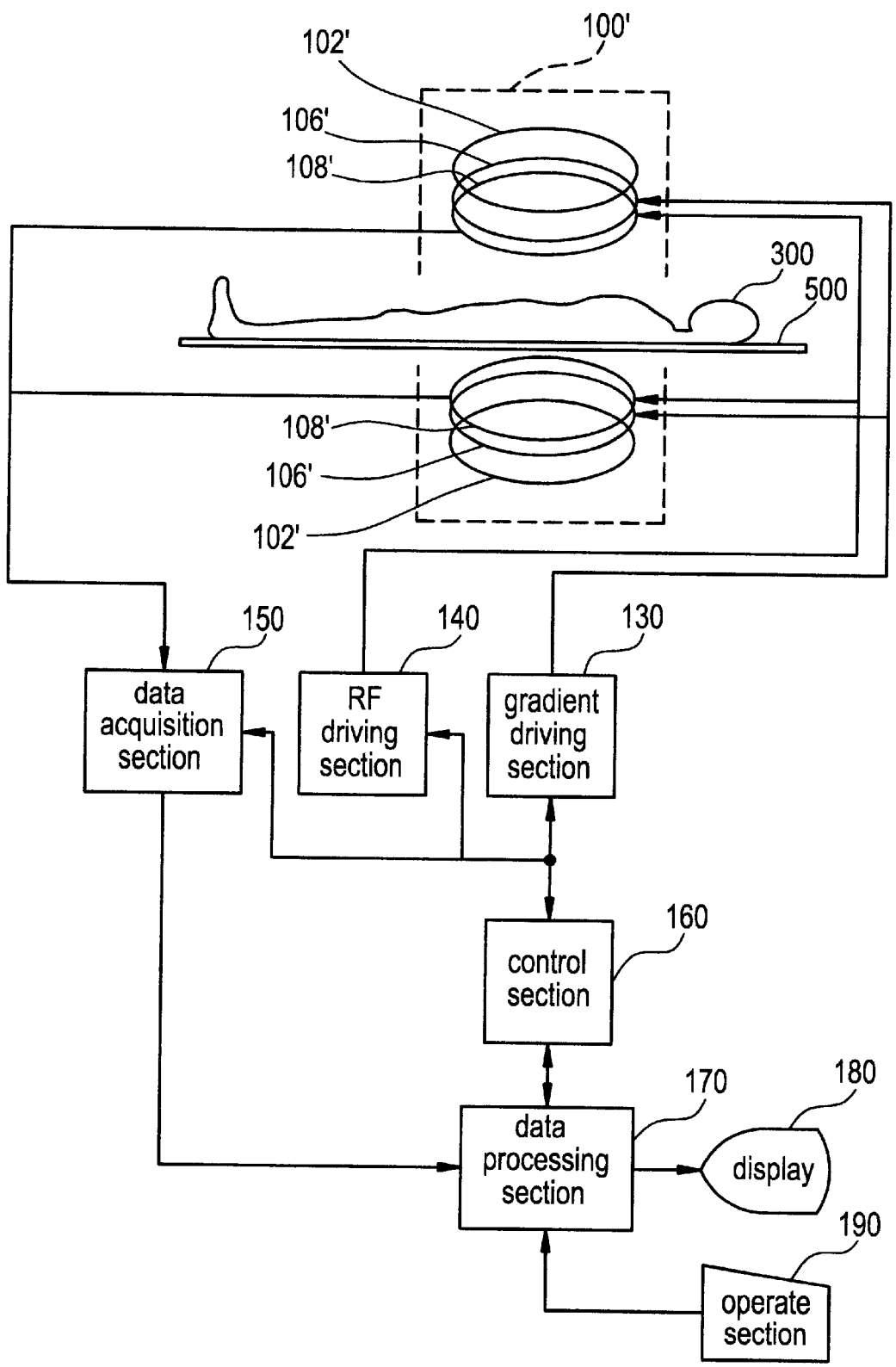
FIG. 4 is a block diagram of an apparatus in accordance with another embodiment of the present invention.

FIG. 4 shows a block diagram of another magnetic resonance imaging apparatus, which is an embodiment of the present invention. The configuration of the apparatus represents an embodiment of the apparatus in accordance with the present invention, and the operation of the apparatus represents an embodiment of the method in accordance with the present invention.

The apparatus shown in FIG. 4 has a different magnet system 100' than the apparatus shown in FIG. 3. Components except the magnet system 100' are configured in a similar manner to those in the apparatus shown in FIG. 3, and similar parts are designated by similar reference numerals and explanation thereof will be omitted.

The magnet system 100' has a main magnetic field magnet section 102', a gradient coil section 106' and an RF coil section 108'. The main magnetic field magnet section 102' and the coil sections 106' and 108' each comprise a pair of respective members facing each other with a space interposed. These sections have a generally disk-like outer shape and are disposed with a common center axis. The subject to be imaged 300 is rested on the cradle 500 and carried into and out of the internal space of the magnet system 100' by carrier means (not shown).

The main magnetic field magnet section 102' generates a static magnetic field in the internal space of the magnet system 100'. The direction of the static magnetic field is generally orthogonal to the direction of the body axis of the subject to be imaged 300, i.e., a so-called vertical magnetic field is generated. The main magnetic field magnet section 102' comprises a permanent magnet, for example. It will be easily recognized that the main magnetic field magnet section 102' is not limited to comprising a permanent magnet, but may comprise a superconductive or normal conductive electromagnet, etc.

The gradient coil section 106' generates gradient magnetic fields for imparting gradients to the static magnet field strength. The gradient magnetic fields to be generated include three types of magnetic fields: a slice gradient magnetic field, a readout gradient magnetic field and a phase encoding gradient magnetic field, and the gradient coil section 106' has three gradient coils (not shown) corresponding to these three gradient magnetic fields.

The RF coil section 108' transmits an RF excitation signal to the static magnetic field space to excite spins within the subject to be imaged 300. The RF coil section 108' also receives a magnetic resonance signal generated by the excited spins. The RF coil section 108' has a transmit coil and a receive coil (not shown). The transmit and receive coils may be either the same coil or separate dedicated coils.

FIG. 5 shows an exemplary pulse sequence for use in magnetic resonance imaging. The illustrated pulse sequence is one for a spin echo (SE) technique.

Specifically, (1) is a sequence of 90° and 180° pulses for RF excitation of the SE technique, and (2), (3), (4) and (5) are sequences of a slice gradient Gs, a readout gradient Gr, a phase encoding gradient Gp and a spin echo MR, respectively, of the SE technique. It should be noted that the 90° and 180° pulses are represented by their respective central signals. The pulse sequence proceeds from the left to the right along a time axis t.

As shown, the 90° pulse results in 90° excitation of the spins. At the same time, the slice gradient Gs is applied to achieve selective excitation for a certain slice. After a predetermined time from the 90° excitation, 180° excitation by the 180° pulse, or spin inversion, is performed. Again, the slice gradient Gs is applied at the same time to achieve selective inversion for the same slice.

In the slice gradient Gs, the polarity in 90° excitation and the polarity in 180° excitation are opposite to each other, unlike the conventional pulse sequence according to the SE technique. It should be noted that the polarity may be positive in 90° excitation and negative in 180° excitation as shown in FIG. 6, instead of the negative polarity in 90° excitation and positive polarity in 180° excitation as shown in FIG. 5.

During the period between the 90° excitation and 180° excitation, the readout gradient Gr and phase encoding gradient Gp are applied. The readout gradient Gr dephases the spins, and the phase encoding gradient Gp phase-encodes the spins.

After the 180° excitation, the spins are rephased by the readout gradient Gr to generate a spin echo MR. The spin echo MR is an RF signal having a symmetrical waveform with respect to the echo center. The central echo occurs after TE (echo time) from the 90° excitation.

The spin echo MR is collected by the data acquisition section 150 as view data. Such a pulse sequence is repeated 128–256 times in a cycle of TR (repetition time). The phase encoding gradient Gp is varied for each repetition to provide different phase encoding each time. Thus, view data for 128–256 views are obtained.

By applying the slice gradient Gs as shown in FIG. 5 or 6, a peripheral region d90 by the gradient magnetic field G90 applied in 90° excitation and a peripheral region d180 by the gradient magnetic field G180 applied in 180° excitation are formed on opposite sides with respect to the FOV. Accordingly, these regions do not overlap, and the peripheral region d90 outside the FOV excited by the 90° pulse is not excited by the 180° pulse. This can prevent generation of spin echoes outside the FOV that causes wraparound artifacts.

The view data obtained by the pulse sequence of FIG. 5 or 6 are collected into the memory in the data processing section 170. It will be easily recognized that the pulse sequence is not limited to the SE technique, but may be of any other appropriate technique such as a fast spin echo (FSE) technique.

The data processing section 170 performs an inverse two-dimensional Fourier transformation on the view data to reconstruct a tomographic image of the subject 300. Since a spin echo is not generated outside the FOV, the reconstructed image will not contain artifacts. Thus, a reconstructed image having a good quality is displayed by the display section 180 as a visual image.

While the preceding description has been made on the case in which the RF excitation is performed by a combination of 90° and 180° excitations, it will be easily recognized that the RF excitation is not limited thereto but may be performed by a combination of excitations with arbitrarily selected α° and β°, or a combination of a plurality of α° excitations.

Many widely different embodiments of the invention may be configured without departing from the spirit and the scope of the present invention. It should be understood that the present invention is not limited to the specific embodiments described in the specification, except as defined in the appended claims.

What is claimed is:

1. A method of applying gradient magnetic fields, said method comprising the steps of:

applying a static magnetic field to a space holding a subject to be imaged;

applying a 90° RF pulse to said subject while at the same time applying a first slice gradient in a slice axis direction of said subject;

applying a 180° RF pulse to said subject while at the same time applying a second slice gradient in said slice axis direction of said subject; and controlling polarity of said first slice gradient and polarity of said second slice gradient to be opposite each other and controlling magnitude and duration of said first slice gradient and said second slice gradient to be similar, whereby said first slice gradient and said second slice gradient restrict field of view to only the slice axis direction and artifacts due to magnetic field ouside of said field of view are prevented from occurring.

2. The method of claim 1, wherein a spin echo technique is used.

3. The method of claim 2, wherein said static magnetic field is applied in a direction parallel to said subject.

4. The method of claim 2, wherein said static magnetic field is applied in a direction perpendicular to said subject.

5. A magnetic resonance imaging method comprising the steps of:

applying a static magnetic field to a space holding a subject to be imaged;

applying a 90° RF pulse to said subject while at the same time applying a first slice gradient in a slice axis direction of said subject;

applying a 180° RF pulse to said subject while at the same time applying a second slice gradient in said slice axis direction of said subject; and controlling polarity of said first slice gradient and polarity of said second slice gradient to be opposite each other and controlling magnitude and duration of said first slice gradient and said second slice gradient to be similar, whereby said first slice gradient and said second slice gradient restrict field of view to only the slice axis direction and artifacts due to magnetic field outside of said field of view are prevented from occurring.

6. The method of claim 5, wherein a slice echo technique is used.

7. The method of claim 6, wherein said static magnetic field is applied in a direction parallel to said subject.

8. The method of claim 6, wherein said static magnetic field is applied in a direction perpendicular to said subject.

9. An apparatus for applying gradient magnetic fields, said apparatus comprising:

means for applying a static magnetic field to a space holding a subject to be imaged;

means for applying a 90° RF pulse to said subject while at the same time applying a first slice gradient in a slice axis direction of said subject;

means for applying a 180° RF pulse to said subject while at the same time applying a second slice gradient in said slice axis direction of said subject; and means for controlling polarity of said first slice gradient and polarity of said second slice gradient to be opposite each other and for controlling magnitude and duration of said first slice gradient and said second slice gradient to be similar, whereby said first slice gradient and said second slice gradient restrict field of view to only the slice axis direction and artifacts due to magnetic fields outside of said field of view are prevented from occurring.

10. The apparatus of claim 9, wherein all of the before mentioned means are operated using a spin echo technique.

11. The apparatus of claim 10, wherein said means for applying a static magnetic field applies same in a direction parallel to said subject.

12. The apparatus of claim 10, wherein said means for applying a static magnetic field applies same in a direction perpendicular to said subject.

13. A magnetic resonance imaging apparatus comprising:

means for applying a static magnetic field to a space holding a subject to be imaged;

means for applying a 90° RF pulse to said subject while at the same time applying a first slice gradient in a slice axis direction of said subject;

means for applying a 180° RF pulse to said subject while at the same time applying a second slice gradient in said slice axis direction of said subject; and means for controlling polarity of said first slice gradient and polarity of said second slice gradient to be opposite each other and for controlling magnitude and duration of said first slice gradient and said second slice gradient to be similar, whereby said first slice gradient and said second slice gradient restrict field of view to only the slice axis direction and artifacts due to magnetic fields outside of said field of view are prevented from occurring.

14. The apparatus of claim 13, wherein all of the before mentioned means are operated using a spin echo technique.

15. The apparatus of claim 14, wherein said means for applying a static magnetic field applies same in a direction parallel to said subject.

16. The apparatus of claim 14, wherein said means for applying a static magnetic field applies same in a direction perpendicular to said subject.

* * * * *